(12) United States Patent
Fukuma et al.

(10) Patent No.: US 8,080,306 B2
(45) Date of Patent: Dec. 20, 2011

(54) EXTERIOR MEMBER, METHOD OF MANUFACTURING EXTERIOR MEMBER, AND ELECTRONIC EQUIPMENT CASING

(75) Inventors: Yohei Fukuma, Chiba (JP); Kiyoto Kusama, Nagano (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/697,584

(22) Filed: Feb. 1, 2010

(65) Prior Publication Data

US 2010/0239832 A1 Sep. 23, 2010

(30) Foreign Application Priority Data

Mar. 18, 2009 (JP) .................................. 2009-066784

(51) Int. Cl.
*B32B 3/00* (2006.01)
(52) U.S. Cl. ...................... 428/195.1; 428/201; 428/203; 428/204; 428/207; 428/323; 428/324; 428/325; 428/327; 428/328; 428/913.3
(58) Field of Classification Search ............... 428/195.1, 428/201, 203, 204, 207, 913.3, 322.2, 323–8
See application file for complete search history.

(56) References Cited

U.S. PATENT DOCUMENTS

| | | | | |
|---|---|---|---|---|
| 5,361,150 A | * | 11/1994 | Noguchi | 349/84 |
| 5,420,575 A | * | 5/1995 | Cheraso et al. | 340/7.63 |
| 6,007,929 A | * | 12/1999 | Robertson et al. | 428/195.1 |
| 6,143,587 A | * | 11/2000 | Omizo | 438/106 |
| 6,168,853 B1 | * | 1/2001 | Feng et al. | 428/207 |
| 6,337,122 B1 | * | 1/2002 | Grigg et al. | 428/195.1 |
| 6,400,037 B1 | * | 6/2002 | Omizo | 257/797 |
| 7,255,911 B2 | * | 8/2007 | Lutz et al. | 428/195.1 |
| 7,300,694 B2 | * | 11/2007 | Lutz et al. | 428/195.1 |
| 7,498,071 B2 | * | 3/2009 | Sakuma et al. | 428/64.4 |

FOREIGN PATENT DOCUMENTS

JP  2008-155117  7/2008

* cited by examiner

*Primary Examiner* — Cathy Lam
(74) *Attorney, Agent, or Firm* — Oblon, Spivak, McClelland, Maier & Neustadt, L.L.P.

(57) ABSTRACT

There is provided an exterior member including a first layer formed on a surface of a substrate and containing coating inclusions and a second layer stacked on a surface of the first layer and containing a material that can allow light to be transmitted therethrough, the light having a wavelength at which optical characteristics of the coating inclusions can be changed. The first layer has a marking portion which is a portion where the optical characteristics of the coating inclusions have changed by laser-irradiation of the light having the wavelength to at least a part of the first layer.

3 Claims, 7 Drawing Sheets

(a)

(b)

(c)

(d)

(e)

US 8,080,306 B2

EXTERIOR MEMBER, METHOD OF MANUFACTURING EXTERIOR MEMBER, AND ELECTRONIC EQUIPMENT CASING

BACKGROUND OF THE INVENTION

1. Field of the Invention

The present invention relates to an exterior member, a method of manufacturing an exterior member, and an electronic equipment casing.

2. Description of the Related Art

In recent years, various molded items patterned by laser marking have been put on the market as products. Such products include, for example, casings of notebook PCs with various patterns formed by laser marking.

For a generally used method of performing laser marking on a casing, there is a method in which first a coating layer is formed on a surface of a substrate and a pattern is marked by a laser and then a clear coating containing a resin, etc., is coated to form a clear layer.

However, the above-described method has an issue that efficiency upon manufacturing is low.

In view of such an issue, for a method for improving the efficiency upon manufacturing, Japanese Patent Application Laid-Open No. 2008-155117, for example, proposes a method in which a coating layer is formed and a clear coating is coated thereon and then marking is performed by a laser.

SUMMARY OF THE INVENTION

In such a current situation, maintenance of high efficiency upon manufacturing, as in a technique disclosed in the above-described Japanese Patent Application Laid-Open No. 2008-155117, and further improvements in the adhesion of a coating layer to a substrate and the durability of the coating layer are sought.

In light of the foregoing, it is desirable to provide an exterior member, a method of manufacturing an exterior member, and an electronic equipment casing, with which high efficiency upon manufacturing is maintained and the adhesion of a coating layer to a substrate and the durability of the coating layer are further improved.

According to an embodiment of the present invention, there is provided an exterior member which includes a first layer formed on a surface of a substrate and containing coating inclusions and a second layer stacked on a surface of the first layer and containing a material that can allow light to be transmitted therethrough, the light having a wavelength at which optical characteristics of the coating inclusions can be changed. The first layer has a marking portion which is a portion where the optical characteristics of the coating inclusions have changed by laser-irradiation of the light having the wavelength to at least a part of the second layer.

The exterior member may further include a third layer between the first layer and the second layer, the third layer containing an inorganic material.

The inorganic material may include at least any one of metal, pearl, mica, and glass.

The first layer may include at least a first marking portion formed by laser-irradiation of light having a first wavelength and a second marking portion formed by laser-irradiation of light having a second wavelength.

The first layer may include a plurality of regions each containing coating inclusions different from each other, and the marking portion may be formed in at least two of the plurality of regions.

According to another embodiment of the present invention, there is provided a method of manufacturing an exterior member which includes the steps of forming a first layer by coating coating inclusions on a surface of a substrate, forming a second layer by coating a material that can allow light to be transmitted therethrough on a surface of the first layer, the light having a wavelength at which optical characteristics of the coating inclusions can change, and forming a marking portion which is a portion where the optical characteristics of the coating inclusions have changed by laser-irradiation of the light having the wavelength to the first layer.

According to another embodiment of the present invention, there is provided an electronic equipment casing formed using an exterior member, the exterior member including a first layer formed on a surface of a substrate and containing coating inclusions and a second layer stacked on a surface of the first layer and containing a material that can allow light to be transmitted therethrough, the light having a wavelength at which optical characteristics of the coating inclusions can be changed. The first layer has a marking portion which is a portion where the optical characteristics of the coating inclusions have changed by laser-irradiation of the light having the wavelength to at least a part of the first layer.

According to the embodiment of the present invention described above, an exterior member, a method of manufacturing an exterior member, and an electronic equipment casing can be provided with which high efficiency upon manufacturing is maintained and the adhesion of a coating layer to a substrate and the durability of the coating layer are further improved.

DETAILED DESCRIPTION OF THE EMBODIMENTS

Figure 1:
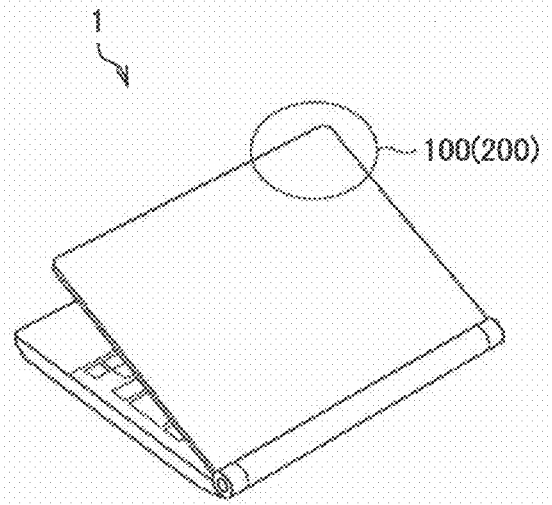
FIG. 1 is an illustrative diagram showing an external configuration of a notebook PC having an electronic equipment casing formed using exterior members according to embodiments of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

[Regarding Flow of Description]

The flow of description herein is as follows. First, with reference to FIGS. 1 and 2, there will be described an external configuration of an electronic equipment casing which is formed using exterior members according to embodiments of the present invention. Then, with reference to FIGS. 3 to 5, a configuration of an exterior member according to a first embodiment of the present invention will be described. Then, with reference to FIG. 6, a method of manufacturing the exterior member according to the first embodiment will be described. Then, with reference to FIG. 7, a configuration of an exterior member according to a second embodiment of the present invention will be described. Then, with reference to FIG. 8, a method of manufacturing the exterior member according to the second embodiment will be described.

1. Regarding external appearance of electronic equipment casing
2. First embodiment
3. Second embodiment

[1. Regarding External Appearance of Electronic Equipment Casing]

First, with reference to FIG. 1, an electronic equipment casing 1 formed using exterior members according to the embodiments of the present invention will be described using a notebook PC as an example. FIG. 1 is an illustrative diagram showing a notebook PC as an example of electronic equipment having exterior members according to the embodiments.

The electronic equipment casing 1 of the notebook PC shown in FIG. 1 is formed using an exterior member 100 (which may be an exterior member 200; this applies to the descriptions with reference to FIG. 1 made below). The external appearance of a display side of a notebook PC is most eye-catching when, for example, the notebook PC is carried in a closed state. Thus, in the exterior member 100, an aesthetic look is sought in terms of design. The electronic equipment casing 1 formed using the exterior member 100 according to the embodiments of the present invention is patterned by marking by a laser.

Figure 2:
FIG. 2 is a photograph showing an external configuration of an electronic equipment casing formed using exterior members according to the embodiments.

Next, with reference to FIG. 2, marking performed on the exterior members 100 and 200 will be described. FIG. 2 is an illustrative diagram showing a photographed exterior member 100 on which marking is performed. By performing laser marking on the exterior member 100, marking portions 110 are formed, whereby a pattern such as that shown in FIG. 2, for example, is formed. By thus forming the marking portions 110 on the exterior member 100 to form a pattern, the aesthetic look of the notebook PC can be improved. Note that although a notebook PC is used as an example of the exterior member 100 on which marking is performed, the applications of the exterior member 100 are not particularly limited and include, for example, electronic equipment such as TVs, digital cameras, mobile phones, and personal audios, automobiles, and buildings.

2. First Embodiment

<2-1. Regarding Structure of Exterior Member 100 According to First Embodiment>

Figure 3:
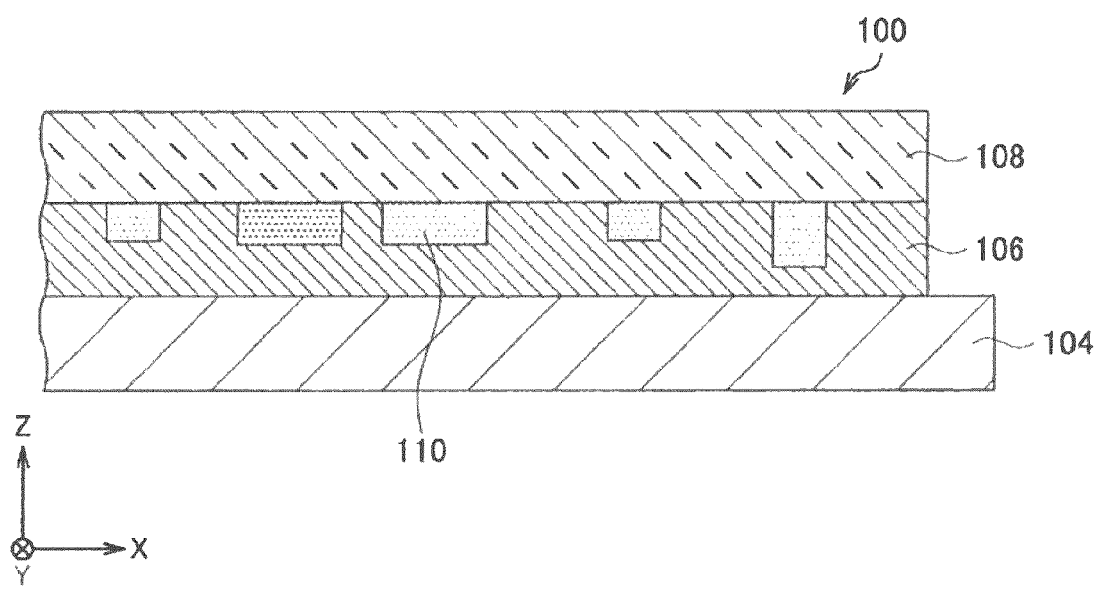
FIG. 3 is a cross-sectional view showing a configuration of an exterior member according to a first embodiment of the present invention.
Figure 4:
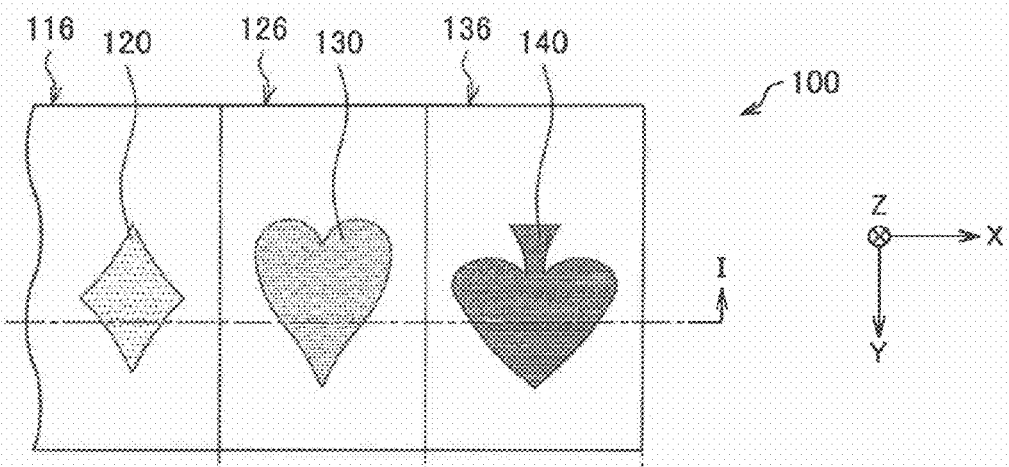
FIG. 4 is a plan view showing an external configuration of an exterior member according to a variant of the first embodiment and a cross-sectional view showing a configuration of the exterior member, respectively.
Figure 4:
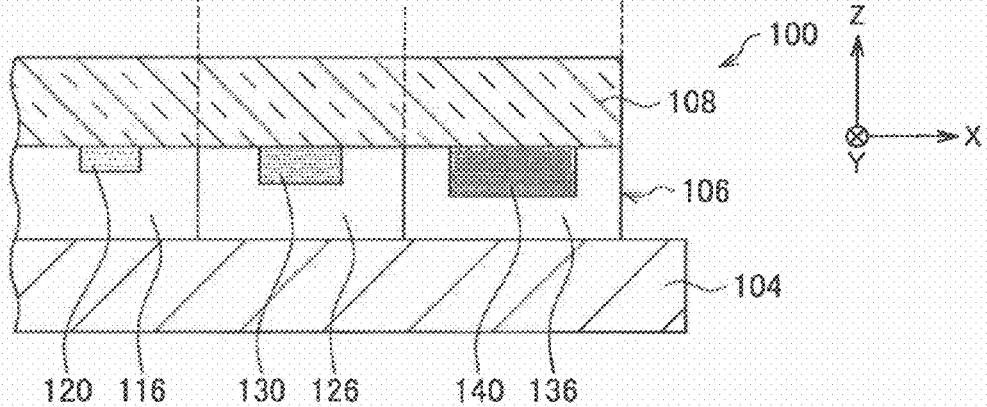

Next, with reference to FIGS. 3 and 4, a configuration of an exterior member 100 according to a first embodiment of the present invention will be described in detail. FIG. 3 is a cross-sectional view showing the configuration of the exterior member 100 according to the first embodiment. FIG. 4 is a plan view showing an external configuration of the exterior member 100 and a cross-sectional view showing a configuration of the exterior member 100, respectively. As used herein, an X direction shown in FIGS. 3 and 4 indicates a direction perpendicular to a thickness direction in which layers of the exterior member 100 are stacked on top of each other. A Y direction shown in FIGS. 3 and 4 indicates a direction perpendicular to the thickness direction in which the layers of the exterior member 100 are stacked on top of each other and orthogonal to the X direction. A Z direction shown in FIGS. 3 and 4 indicates the thickness direction in which the layers of the exterior member 100 are stacked on top of each other. Note that an X direction, a Y direction, and a Z direction in FIGS. 5 and 8A to 8E which will be described later are substantially the same as the X direction, the Y direction, and the Z direction shown in FIGS. 3 and 4 and thus description thereof is omitted below.

As shown in FIG. 3, an exterior member 100 has a structure in which a coating layer 106 and a light-transmitting layer 108 are stacked on top of each other on a substrate 104. Note that the coating layer 106 is an example of a first layer according to the present embodiment. Note also that the light-transmitting layer 108 is an example of a second layer according to the present embodiment.

The coating layer 106 is formed on a surface of the substrate 104 as the lowermost layer. The coating layer 106 is made of coating inclusions. The coating inclusions include a color material containing a dye or pigment, a resin, a solvent, etc. In the present embodiment, marking portions 110 are to be formed in the coating layer 106 by laser-irradiation of light 102, and thus, the coating inclusions can be any as long as the marking portions 110 can be formed in the coating layer 106 by irradiation of light 102 having a predetermined wavelength. Specifically, the coating inclusions can be any of thermosetting resin coatings and thermoplastic resin coatings. Examples of the coating inclusions include synthetic acrylic resin coatings, synthetic acrylic-melamine resin coatings, synthetic epoxy resin coatings, synthetic polyester resin coatings, synthetic polyurethane resin coatings, synthetic alkyd resin coatings, and synthetic melamine resin coatings. In addition, examples of the coating inclusions include synthetic phenolic resin coatings, synthetic urea resin coatings, synthetic unsaturated polyester resin coatings, and synthetic polyimide resin coatings.

The coating layer 106 has the marking portions 110 formed by laser-irradiation of the light 102 having a predetermined wavelength. The marking portions 110 are portions formed by irradiating light 102 having a wavelength at which the optical characteristics of the above-described coating inclusions can change, to at least a part of the coating layer 106 to change the optical characteristics of the coating inclusions in the coating layer 106.

Here, the change in optical characteristics is, for example, that a color material in the coating inclusions reacts to the laser-irradiation of the light 102 and is thereby decomposed or that the reflectivity or absorptance of light changes. In addition, the change in optical characteristics may be, for example, that a resin, a solvent, or the like, other than a color material causes a reaction and is thereby decomposed or that the reflectivity or absorptance of light changes. The degree of change in the optical characteristics of the coating inclusions in the coating layer 106 caused by the laser-irradiation of the light 102 varies depending on the types of color material, resin, and solvent in the coating inclusions, etc. Furthermore, the degree of change in optical characteristics varies depending on the wavelength of the light 102, the intensity of a laser that irradiates the light 102, the irradiation time of the light 102, the interaction therebetween, etc. Thus, by changing the types of color material, resin, and solvent in the coating inclusions, the wavelength of the light 102, the intensity of a laser that irradiates the light 102, the irradiation time of the light 102, etc., depending upon the location where the light 102 is irradiated, the coating layer 106 is provided with a plurality of kinds of marking portions 110 with different color shades, color tones, etc. By this, a more delicate and complicated design can be provided on a surface of the exterior member 100.

Now, an example of a coating layer 106 having a plurality of kinds of marking portions 110 with different color shades, color tones, etc., will be described with reference to FIGS. 4a and 4b. FIG. 4a is a plan view of a surface of an exterior member 100 as seen from a positive Z direction. FIG. 4b is a cross-sectional view of the exterior member 100 taken along line I-I of FIG. 4b. In the example shown in FIGS. 4a and 4b, a coating layer 106 has three regions each containing coating inclusions different from each other and each region has a marking portion formed therein. Specifically, as shown in FIGS. 4a and 4b, the coating layer 106 has a region 116 containing first coating inclusions, a region 126 containing second coating inclusions, and a region 136 containing third coating inclusions. A marking portion 120 is formed in the region 116, a marking portion 130 is formed in the region 126, and a marking portion 140 is formed in the region 136.

As described above, the coating inclusions contained in the respective regions 116, 126, and 136 where the marking portion 120, the marking portion 130, and the marking portion 140 are formed, respectively, are different from one another. Hence, by laser-irradiating the light 102 having a predetermined wavelength to each of the regions 116, 126, and 136, the degree of change in optical characteristics varies between the coating inclusions contained in the respective regions 116, 126, and 136. As shown in FIG. 4a, a color shade, a color tone, etc., vary between the marking portion 120, the marking portion 130, and the marking portion 140. In this manner, a pattern, such as that shown in FIG. 4a, in which the color shade, color tone, etc., of a marking portion vary depending upon the location can be formed on the exterior member 100.

The coating layer 106 having a plurality of regions formed using different coating inclusions in the XY directions have been described above with reference to FIGS. 4a and 4b. Next, with reference to FIG. 5, an example in which a coating layer 106 has a plurality of regions formed using different coating inclusions in the Z direction will be described.

Figure 5:
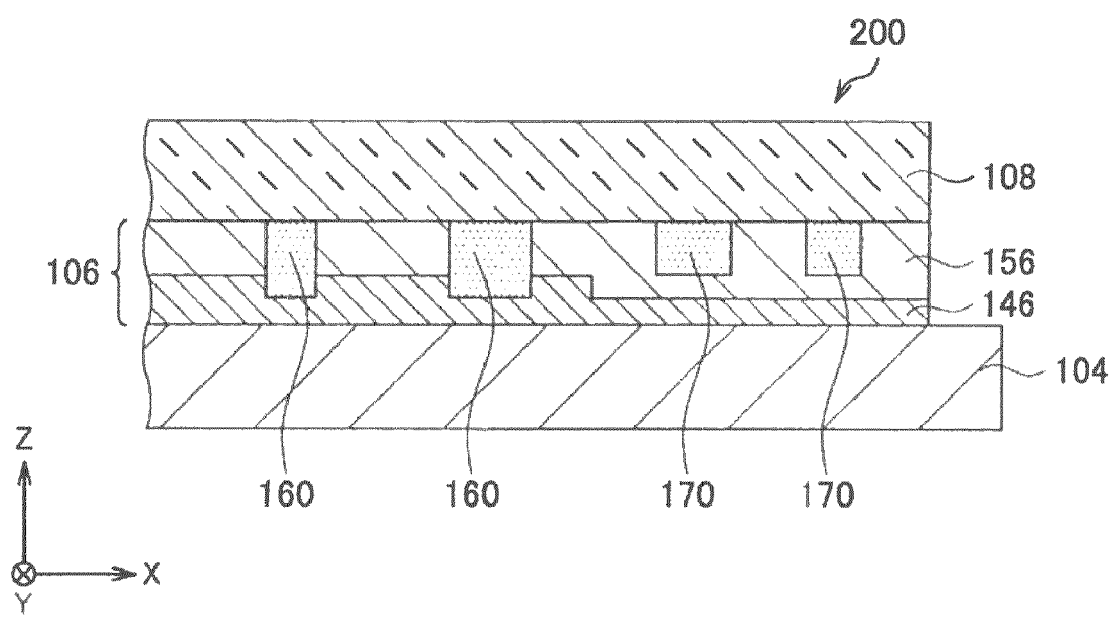
FIG. 5 is a cross-sectional view showing the configuration of the exterior member according to the first embodiment.

As shown in FIG. 5, a coating layer 106 has a structure in which a coating layer 146 and a coating layer 156 are sequentially stacked on top of each other on a substrate 104. As described above, marking portions are formed in the coating layer 106 and the forms thereof include one in which marking portions (marking portions 160) are formed in both the coating layer 146 and the coating layer 156 and one in which marking portions (marking portions 170) are formed only in the coating layer 156 which is provided on the side of the light-transmitting layer 108.

More specifically, when the coating layer 156 which is provided on the side of the light-transmitting layer 108 contains, in the Z direction, coating inclusions that change optical characteristics and the coating inclusions can allow a part of light 102 to be transmitted therethrough, the part of the light 102 is also irradiated to the coating layer 146. As a result, the optical characteristics of the coating inclusions in the coating layer 146 and the coating inclusions in the coating layer 156 change, whereby marking portions 160 are formed. On the other hand, when coating inclusions contained in the coating layer 156 which is provided on the side of the light-transmitting layer 108 may not allow light 102 to be transmitted therethrough, the light 102 is not irradiated to the coating layer 146 and thus the optical characteristics of only the coating inclusions in the coating layer 156 change, whereby marking portions 170 are formed.

Here, when the exterior member 100 is seen from the side of the light-transmitting layer 108, the marking portions 160 are recognized by the user's eyes such that a change in the optical characteristics of the coating layer 146 and a change in the optical characteristics of the coating layer 156 are superimposed on each other. On the other hand, when the exterior member 100 is seen from the side of the light-transmitting layer 108, the marking portions 170 are recognized by the user's eyes such that the coating layer 146 itself whose optical characteristics have not changed and a change in the optical characteristics of the coating layer 156 are superimposed on each other. Therefore, the marking portions 160 and the marking portions 170 are recognized by the user's eyes such that they have different shades, color tones, etc. By thus forming the marking portions 160, the marking portions 170, etc., a more delicate and complicated design is provided on a surface of the exterior member 100.

Next, with reference back to FIG. 3, description of the configuration of the exterior member 100 is continued.

The light-transmitting layer 108 is stacked on a surface of the coating layer 106 as the uppermost layer. The light-transmitting layer 108 is formed using a light-transmitting material which can allow light 102 to be transmitted therethrough. The light-transmitting material can allow the light 102 to be transmitted therethrough but does not need to allow all the light 102 to be transmitted therethrough and may allow only a part of the light 102 to be transmitted therethrough. In addition, the light-transmitting material may be colorless and transparent but not necessarily needs to be colorless and may be colored. That is, the light-transmitting material can be any as long as the material can allow laser-irradiated light 102 to be transmitted therethrough.

The light-transmitting material includes a resin and a solvent. Here, specifically, the light-transmitting material may be any of clear thermosetting resin coatings and clear thermoplastic resin coatings. Examples of the light-transmitting material includes clear UV-curable resin coatings, clear synthetic acrylic resin coatings, clear synthetic acrylic-melamine resin coatings, clear synthetic epoxy resin coatings, and clear synthetic polyester resin coatings. In addition, examples of the light-transmitting material includes clear synthetic phenolic resin coatings, clear synthetic urea resin coatings, clear synthetic unsaturated polyester resin coatings, and clear synthetic polyimide resin coatings. Furthermore, the light-transmitting material includes, for example, clear synthetic alkyd resin coatings, clear synthetic polyurethane resin coatings, and clear synthetic melamine resin coatings.

The light-transmitting material allows the light 102 emitted from a laser used to form marking portions to be transmitted therethrough. Hence, even when the light 102 is laser-irradiated to the exterior member 100, the light-transmitting layer 108 is not destroyed or the coating layer 106 is not peeled off from the substrate 104 and the coating layer 106 can be protected from exposure. As a result, the adhesion of the coating layer 106 of the exterior member 100 to the substrate 104 and the durability of the coating layer 106 are ensured. Note that the durability includes the mechanical strength, light fastness, etc., of the coating layer 106 and the light-transmitting layer 108 which configure the exterior member 100.

<2-2. Regarding Method of Manufacturing Exterior Member 100 According to First Embodiment>

Figure 6:
FIG. 6 is illustrative diagrams showing a method of manufacturing the exterior member according to the first embodiment.
Figure 6:
Figure 6:
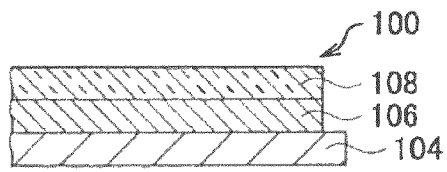
Figure 6:
Figure 6:
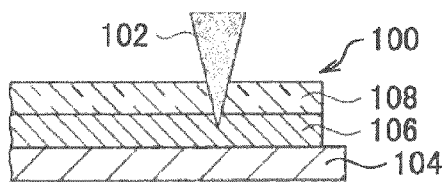
Figure 6:
Figure 6:
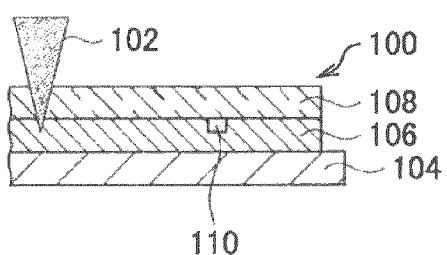
Figure 6:
Figure 6:
Figure 6:
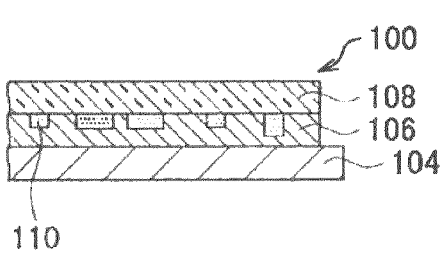
Figure 6:
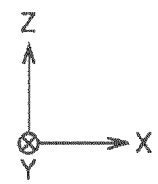

Next, with reference to FIG. 6, a method of manufacturing the exterior member 100 according to the first embodiment of the present invention will be described. FIG. 6 is illustrative diagrams showing the method of manufacturing the exterior member 100.

First, as shown in FIG. 6a, coating inclusions are coated on the surface of the substrate 104, whereby the coating layer 106 is formed. Here, coating means for the coating inclusions include, for example, spraying with a spray, brush coating, coating with a roller coater or bar coater, and printing with an inkjet printer.

Then, as shown in FIG. 6b, a light-transmitting material is coated on a surface of the formed coating layer 106, whereby the light-transmitting layer 108 is formed. Coating means for the light-transmitting material are the same as those for the coating inclusions. As a result, as shown in FIG. 6c, the coating layer 106 and the light-transmitting layer 108 are sequentially stacked on top of each other in a positive Z direction on the substrate 104.

Then, as shown in FIG. 6c, the light 102 is laser-irradiated toward the coating layer 106 from the side of the light-transmitting layer 108. As a result, as shown in FIG. 6d, a marking portion 110 is formed in a portion of the coating layer 106 of the exterior member 100 where the light 102 is irradiated. Furthermore, after a certain marking portion 110 is formed, by irradiating the light 102 to any area, a new marking portion 110 is formed. In this manner, as shown in FIG. 6e, marking portions 110 are formed in a plurality of areas in the exterior member 100.

Here, when marking portions 110 are formed, since the light-transmitting material of the light-transmitting layer 108 can allow the light 102 having the aforementioned wavelength to be transmitted therethrough, the light-transmitting layer 108 is not destroyed by irradiation of the light 102. Hence, marking portions 110 are formed by irradiation of the light 102 with the coating layer 106 being protected by the light-transmitting layer 108. That is, the exterior member 100 can be patterned with durability and adhesion being maintained.

Generally, in a method of manufacturing an exterior member, high-speed and precise layer formation is sought and thus multi-layer formation using an inkjet printer, etc., may be performed. In a manufacturing method for this case, in order to prevent a clear layer from being destroyed when multi-layer formation is performed using an inkjet printer, etc., the formation of layers is stopped temporarily and marking is performed by a laser and then a clear layer is formed. However, in the method of manufacturing the exterior member 100 according to the present embodiment, since irradiation of the light 102 is performed after the formation of all of the substrate 104, the coating layer 106, and the light-transmitting layer 108, manufacturing efficiency is improved over that in related art.

For a laser that irradiates the light 102, for example, a YAG ($Y_3Al_5O_{12}$: yttrium-aluminum-garnet) laser can be used. Note that the light 102 is not limited to that emitted from a YAG laser and may be that emitted from other lasers. When the YAG laser is used, the wavelength of the light 102 used to form the marking portions 110 is 532 nm or 1064 nm. To adjust the degrees of change in the shades, etc., of the marking portions 110, the wavelength of the light 102 may be changed according to a position in the X direction or the Y direction. Furthermore, lights 102 having different wavelengths may be irradiated to one and the same area.

Also, by controlling the intensity of the light 102, the degrees of change in the colors of the marking portions 110 can be adjusted.

3. Second Embodiment

<3-1. Regarding Internal Configuration of Exterior Member 200 According to Second Embodiment>

Next, with reference to FIG. 7, a configuration of an exterior member 200 according to a second embodiment of the present invention will be described in detail. The exterior member 200 has a structure in which a coating layer 106, an inorganic layer 112, and a light-transmitting layer 108 are stacked on top of one another on a substrate 104. Note that the inorganic layer 112 is an example of a third layer according to the present embodiment.

Figure 7:
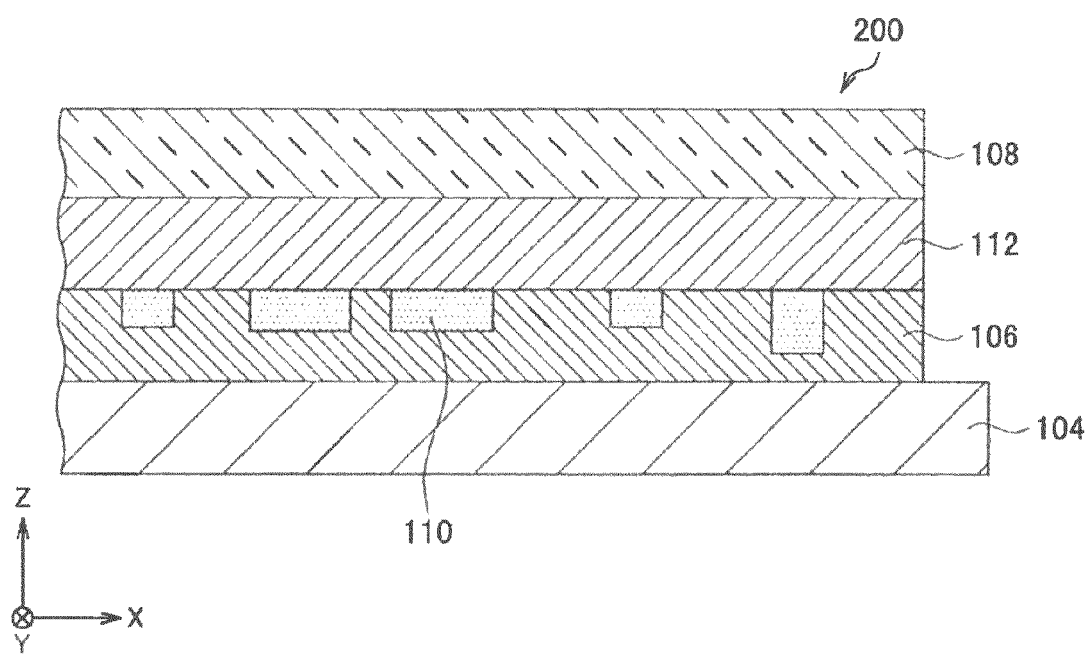
FIG. 7 is a cross-sectional view showing a configuration of an exterior member according to a second embodiment of the present invention.

As shown in FIG. 7, the substrate 104, the coating layer 106, and the light-transmitting layer 108 have substantially the same configuration as the substrate 104, the coating layer 106, and the light-transmitting layer 108 according to the first embodiment. Thus, in the second embodiment of the present invention, of the components of the exterior member 200, the inorganic layer 112 will be mainly described and description of the same components as those in the first embodiment is omitted.

The inorganic layer 112 contains an inorganic material. The inorganic material includes at least any one of, for example, metal, pearl, mica, and glass. The metal includes, for example, gold (Au), silver (Ag), copper (Cu), aluminum (Al), iron (Fe), lead (Pb), cobalt (Co), and nickel (Ni).

When the inorganic layer 112 contains metal, since the metal reflects light, the exterior member 200 has luster. An inorganic material that can be contained in the inorganic layer 112 has high mechanical strength and thus can improve durability.

<3-2. Regarding Method of Manufacturing Exterior Member 200 According to Second Embodiment>

Figure 8:
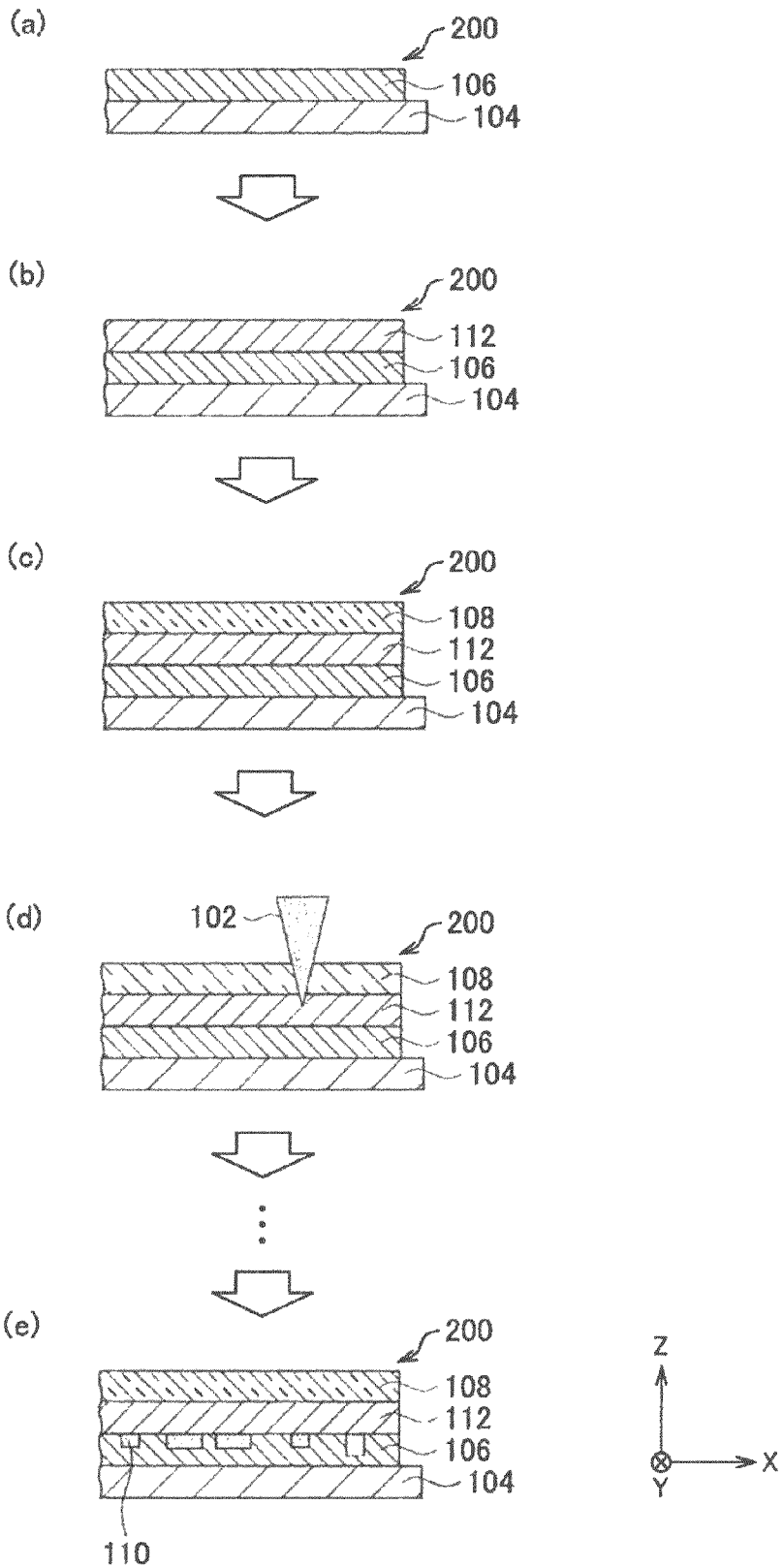
FIG. 8 is illustrative diagrams showing a method of manufacturing the exterior member according to the second embodiment.

Next, a method of manufacturing the exterior member 200 according to the second embodiment of the present invention will be described. FIG. 8 is illustrative diagrams showing the method of manufacturing the exterior member 200.

First, as shown in FIG. 8a, coating inclusions are coated on the surface of the substrate 104, whereby the coating layer 106 is formed. Then, as shown in FIG. 8b, an inorganic material is coated on the surface of the coating layer 106 thus formed, whereby the inorganic layer 112 is formed. Then, a light-transmitting material is coated on the surface of the inorganic layer 112 thus formed, whereby the light-transmitting layer 108 is formed. As shown in FIG. 8c, the coating layer 106, the inorganic layer 112, and the light-transmitting layer 108 are sequentially stacked on top of one another in a positive Z direction on the substrate 104. For a manufacturing method for sequentially stacking the coating layer 106, the inorganic layer 112, and the light-transmitting layer 108 on top of one another on the substrate 104, the same method as a method of manufacturing an exterior member 100 according to the first embodiment can be used. For example, the inorganic layer 112 can be formed by the same method as methods of forming the coating layer 106 and the light-transmitting layer 108.

Then, when, as shown in FIG. 8d, light 102 is laser-irradiated toward the coating layer 106 from the side of the light-transmitting layer 108, as shown in FIG. 8E, marking portions 110 are formed in the coating layer 106. In this case, marking portions 110 may also be formed in the inorganic layer 112 by laser irradiation of the light 102. Note that regardless of the presence or absence of marking portions 110 formed in the inorganic layer 112, since the light-transmitting layer 108 protects the coating layer 106, the durability of the coating layer 106 and the adhesion of the coating layer 106 to the substrate 104 are maintained. When, as shown in FIG. 8, marking portions 110 are not formed in the inorganic layer 112, the inorganic layer 112 also serves to protect the coating layer 106, together with the light-transmitting layer 108. When the inorganic layer 112 contains metal, since the metal in the inorganic layer 112 reflects light, the exterior member 200 has luster. As such, since the exterior member 200 has the inorganic layer 112, the luster increases and accordingly the exterior member 200 with a luxurious look can be formed.

It should be understood by those skilled in the art that various modifications, combinations, sub-combinations and alterations may occur depending on design requirements and other factors insofar as they are within the scope of the appended claims or the equivalents thereof.

The present application contains subject matter related to that disclosed in Japanese Priority Patent Application JP 2009-66784 filed in the Japan Patent Office on Mar. 18, 2009, the entire content of which is hereby incorporated by reference.

What is claimed is:

1. An exterior member comprising:
  a first coating layer formed on a surface of a substrate and containing coating inclusions;
  a second coating layer formed on a surface of the first coating layer and containing coating inclusions; and
  a light-transmitting layer formed on a surface of the second coating layer that allows light to be transmitted therethrough, the light having a wavelength at which optical characteristics of the coating inclusions of the first and second coating layers can be changed,
  wherein the first and second coating layers include a first marking portion where the optical characteristics of the coating inclusions of the first and second coating layers have changed by laser-irradiation of the light.

2. The exterior member according to claim 1, wherein
  the first and second layers include a plurality of regions each containing coating inclusions different from each other, and
  the first marking portion is formed in at least two of the plurality of regions.

3. An electronic equipment casing formed using an exterior member, the exterior member comprising:
  a first coating layer formed on a surface of a substrate and containing coating inclusions;
  a second coating layer formed on a surface of the first coating layer and containing coating inclusions; and
  a light-transmitting layer formed on a surface of the second coating layer that allows light to be transmitted therethrough, the light having a wavelength at which optical characteristics of the coating inclusions of the first and second coating layers can be changed,
  wherein the first and second coating layers include a first marking portion where the optical characteristics of the coating inclusions of the first and second coating layers have changed by laser-irradiation of the light.

\* \* \* \* \*